United States Patent [19]

Kawamura et al.

[11] Patent Number: 5,801,956
[45] Date of Patent: Sep. 1, 1998

[54] METHOD FOR DECIDING THE FEASIBILITY OF LOGIC CIRCUIT PRIOR TO PERFORMING LOGIC SYNTHESIS

[75] Inventors: Hajime Kawamura, Tokyo; Takeharu Nemoto; Takuo Nakaki, both of Kanagawa, all of Japan

[73] Assignee: NEC Corporation, Tokyo, Japan

[21] Appl. No.: 667,334

[22] Filed: Jun. 20, 1996

Related U.S. Application Data

[63] Continuation of Ser. No. 357,286, Dec. 13, 1994, abandoned.

[30] Foreign Application Priority Data

Dec. 13, 1993 [JP] Japan .................. 5-311815

[51] Int. Cl.⁶ .................................................. G06F 17/50
[52] U.S. Cl. ................... 364/489; 364/489; 364/578; 371/22.1; 371/22.2; 371/22.36; 324/500
[58] Field of Search ........................ 364/489, 578, 364/488, 490; 371/22.1, 22.3, 22.36, 28, 23; 324/500, 537, 765

[56] References Cited

U.S. PATENT DOCUMENTS

| | | | |
|---|---|---|---|
| 4,228,537 | 10/1980 | Henckels et al. | 395/183.09 |
| 4,481,628 | 11/1984 | Pasquinelli | 371/28 |
| 4,594,677 | 6/1986 | Barlow | 364/578 |
| 4,602,210 | 7/1986 | Fasang et al. | 324/73 R |
| 4,823,278 | 4/1989 | Kikuchi et al. | 364/491 |
| 4,882,690 | 11/1989 | Shinsha et al. | 364/490 |
| 4,890,238 | 12/1989 | Klein et al. | 364/491 |
| 4,908,772 | 3/1990 | Chi | 364/491 |
| 4,967,367 | 10/1990 | Piednoir | 364/489 |
| 5,029,102 | 7/1991 | Drumm et al. | 364/488 |
| 5,095,454 | 3/1992 | Huang | 364/578 |
| 5,222,030 | 6/1993 | Dangelo et al. | 364/489 |
| 5,331,568 | 7/1994 | Pixley | 364/489 |
| 5,383,167 | 1/1995 | Weil | 364/488 |
| 5,418,735 | 5/1995 | Saitoh | 364/578 |

*Primary Examiner*—Kevin J. Teska
*Assistant Examiner*—Thai Phan
*Attorney, Agent, or Firm*—Foley & Lardner

[57] ABSTRACT

A logic circuit design procedure comprises a step of deciding the feasibility of hardware after HDL description and functional verification, and a step of performing logic synthesis of the HDL description which has been determined to be feasible. The feasibility decision step comprises at least a decision on the possibility of spike transfer and a decision on oscillation. The spike transfer check step determines whether at least one of a clock signal and a reset signal of any sequential circuit is output from a combinational circuit. The oscillation check step determines whether an output signal of any combinational circuit is recursively input thereto without passing through a sequential circuit. Only the HDL description which passes the feasibility test is allowed to enter the logic synthesis stage.

12 Claims, 13 Drawing Sheets

FIG.5

```
PORT(IN1,IN2,IN3:in bit;
     OUT1,OUT2:out bit);

SIGNAL S1    :BIT VECTOR(7 down to 0);
SIGNAL S2,S3,S4, :BIT;

501 ──► P1:process (IN1,IN2,IN3,S3)
        begin
503 ──► wait until (IN1'EVENT)and(IN1='1')
504 ──►    if IN2='1' then
506 ──►       S1<="10101010" after 1ns;
           else
505 ──►       S2<=S3 after 1ns;
           end if;
           if IN3='0' then
              OUT1<=S3 after 1ns;
           end if;
502 ──► end process;

P2 : process (S1,S2,S3)
        begin
           wait until (S3'EVENT)and(S3='1')
507 ──►       if S1="11111111"andS2='1' then
                 OUT2<=S4
              end if;
           end process;

P3 : process (IN2,S4)
        begin
           if IN2='0' then
              S3<='0' after 1ns;
           else if S4=IN2 then
              S4<='1' after 1ns;
           end if;
           end process;
```

51 INPUT AND OUTPUT DECLARATION
52 SIGNAL LINE DECLARATION
53a DESCRIPTION UNIT OF SEQUENTIAL CIRCUIT
53b DESCRIPTION UNIT OF SEQUENTIAL CIRCUIT
54 DESCRIPTION UNIT OF COMBINATIONAL CIRCUIT

FIG. 7

| DESCRIPTION UNIT | OUTPUT SIGNAL | INPUT SIGNAL |
|---|---|---|
| P1 | S1 | IN1.IN2 |
|    | S2 | IN1.IN2.S3 |
|    | OUT1 | IN1.IN2.S3 |
| P2 | OUT2 | S1.S2.S3.S4 |
| P3 | S3 | IN2 |
|    | S4 | IN2.S4 |

53a — P1 rows
53b — P2 row
54 — P3 rows

FIG. 8

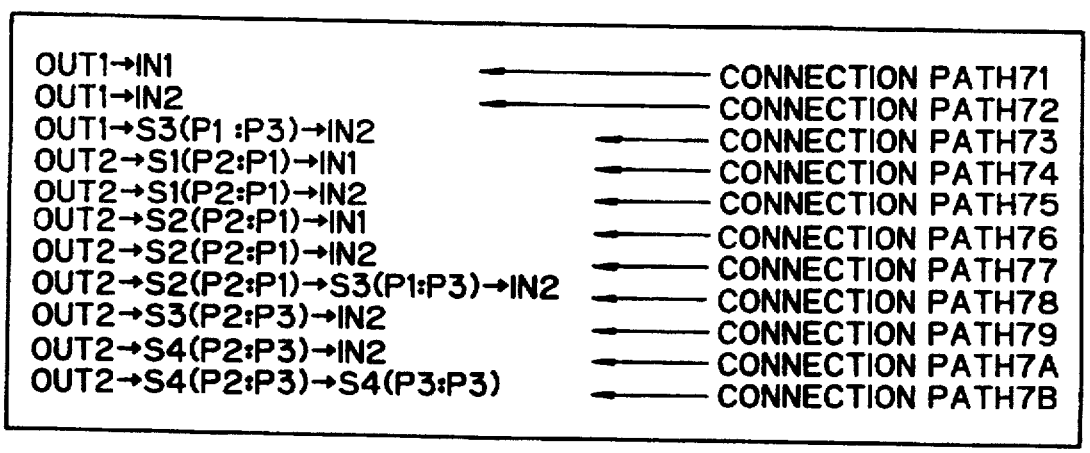

```
OUT1→IN1                              ───────── CONNECTION PATH71
OUT1→IN2                              ───────── CONNECTION PATH72
OUT1→S3(P1:P3)→IN2                    ───────── CONNECTION PATH73
OUT2→S1(P2:P1)→IN1                    ───────── CONNECTION PATH74
OUT2→S1(P2:P1)→IN2                    ───────── CONNECTION PATH75
OUT2→S2(P2:P1)→IN1                    ───────── CONNECTION PATH76
OUT2→S2(P2:P1)→IN2                    ───────── CONNECTION PATH77
OUT2→S2(P2:P1)→S3(P1:P3)→IN2          ───────── CONNECTION PATH78
OUT2→S3(P2:P3)→IN2                    ───────── CONNECTION PATH79
OUT2→S4(P2:P3)→IN2                    ───────── CONNECTION PATH7A
OUT2→S4(P2:P3)→S4(P3:P3)              ───────── CONNECTION PATH7B
```

FIG. 10

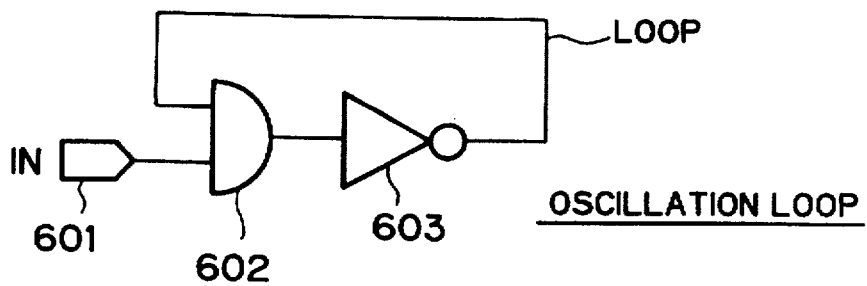

OSCILLATION LOOP

IF STATEMENT

ASSIGNMENT STATEMENT

METHOD FOR DECIDING THE FEASIBILITY OF LOGIC CIRCUIT PRIOR TO PERFORMING LOGIC SYNTHESIS

This application is a continuation of application Ser. No. 08/357,286, filed Dec. 13, 1994, abandoned now.

BACKGROUND OF THE INVENTION

1. Field of the Invention

The present invention relates to a design system for logic circuits described by using a hardware description language (HDL) and, more particularly, to a system for deciding the feasibility of a logic circuit.

2. Description of the Prior Art

Recent advances in integrated circuit technology have made it possible to manufacture a microprocessor integrating very large numbers of transistors and an application-specific integrated circuit (ASIC) attaining real-time processing of color motion images and the like. Since it is necessary in such integrated circuits to design a logic circuit with gates numbering more than five hundred thousand, the current mainstream practice is to perform design by using the HDL. HDL has a variety of features suitable for the purpose of automating design and shortening the development period. For instance, HDL enables the direct description of detailed timing information and logic synthesis and operation verification can be conducted easily.

In the functional design of hardware using HDL, HDL description data is functionally verified before it is converted into a logic circuit using a logic synthesis tool. After performing logic synthesis, the feasibility of the subject of design is determined using the connection relationships, the delay information, the circuit scale information of the logic circuit. At such a stage, if a problem in timing such as spikes, oscillations, or delays are detected, the process returns to the HDL description stage to correct the HDL description. The feasibility is then decided again through functional verification and logic synthesis.

However, in an integrated circuit having an enormous number of gates, repeating the functional verification and the logic synthesis results in significant extension of the period of development.

SUMMARY OF THE INVENTION

An object of the invention is to provide a logic circuit design method which enables the design period of an integrated circuit to be shortened.

The logic circuit design procedure according to the present invention comprises a step of deciding the feasibility of hardware after HDL description and functional verification, and a step of performing logic synthesis of the HDL description which has been determined to be feasible. The feasibility decision step comprises at least a decision on the possibility of spike transfer and a decision on oscillation.

More specifically, after producing an HDL description of a subject LSIC, a feasibility decision is performed. The feasibility decision is comprised of the spike transfer check for determining whether at least one of a clock signal and a reset signal of any sequential circuit is output from a combinational circuit, and the oscillation check for determining whether an output signal of any combinational circuit is recursively input thereto without passing through a sequential circuit. Only the HDL description which passes the feasibility test is allowed to enter the logic synthesis stage.

BRIEF DESCRIPTION OF THE DRAWINGS

This above-mentioned invention and other objects, features, and advantages will become more apparent with reference to the following detailed description of the invention taken in conjunction with the accompanying drawings, wherein:

FIG. 5 is an example of an HDL description;

FIG. 7 is a set of connection relationships based on the HDL description in FIG. 5;

FIG. 8 is a connection relationship listing obtained from the connection relationships shown in FIG. 7;

FIG. 10 is a block diagram showing an example of a logic circuit configuration generating oscillation;

DESCRIPTION OF THE PREFERRED EMBODIMENTS

Figure 1:
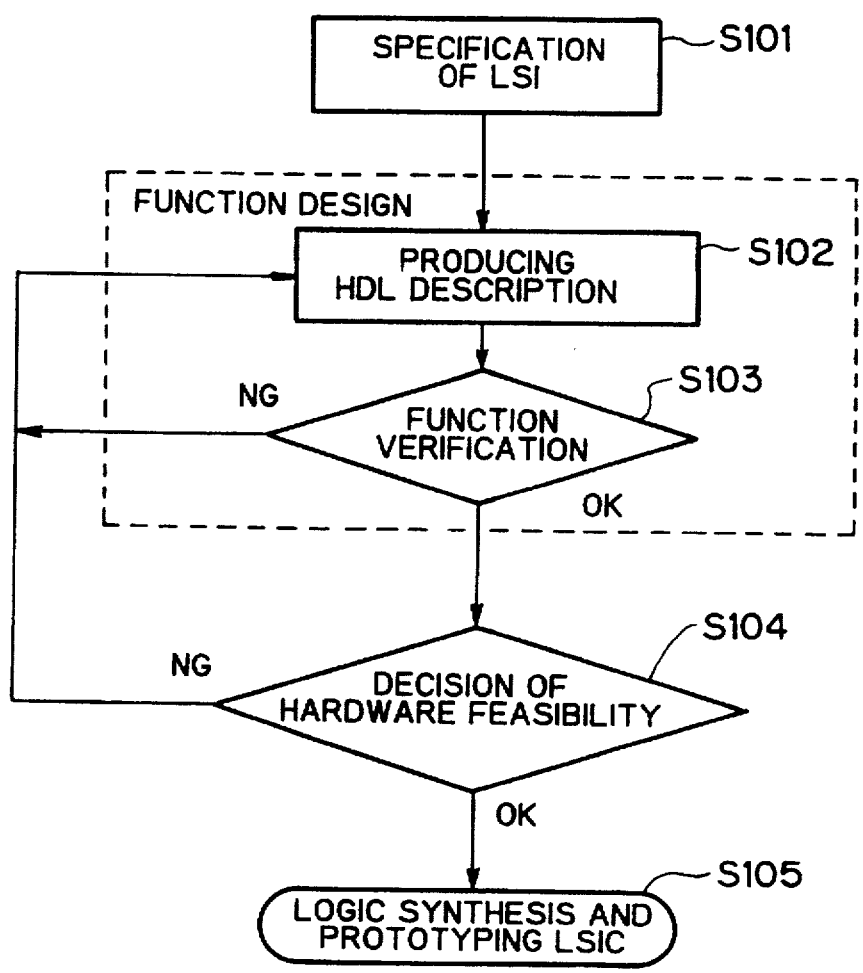
FIG. 1 is a flowchart schematically showing the operation of a design system according to the present invention.

The design procedure of the logic circuit design system according to the present invention decides hardware feasibility prior to the logic synthesis of an HDL description. As shown in FIG. 1, once the specifications of a logic circuit (LSI) are determined (S101), the HDL description is prepared according to the specifications (S102), and functional verification is performed (S103). If the functional verification fails (NG in S103), the HDL description is corrected. If the functional inspection is passed (OK in S103), then the feasibility of hardware is decided (S104). If the hardware is determined to be difficult to implement, the process returns to the step for preparing the HDL description (S102), while, when high feasibility is involved, its logic synthesis is performed, and the process enters the LSI prototyping stage (S105).

Figure 2:
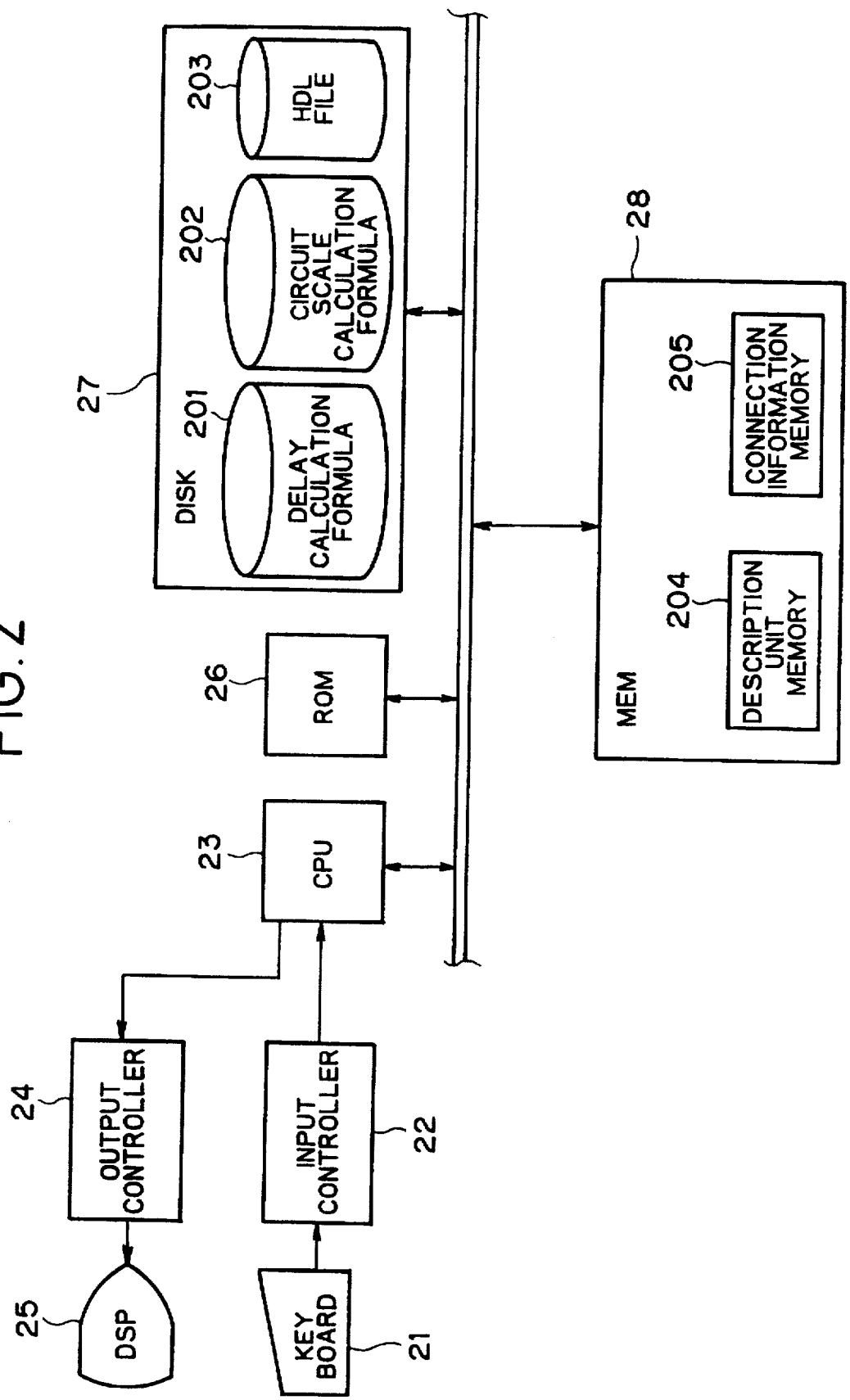
FIG. 2 is a block diagram showing an example of the design system according to the present invention.

In the design system shown in FIG. 2, information entered from a keyboard 21 for identifying the functions of a subject circuit is input to a system controller (CPU) 23 through an input controller 22. The CPU 23 performs hardware feasibility decision processing, and the result is displayed on a display 25 through an output controller 24.

A read-only memory (ROM) 26 is used to store a program representing the procedure for feasibility decision processing. Based on the program, the CPU 23 executes feasibility decision processing by using information data stored in a magnetic disk drive (DISK) 27 and a memory (MEM) 28.

The DISK 27 is comprised of a delay calculation formula file 201 containing an estimation formula for calculating delay time in the LSIC, a circuit scale calculation formula file 202 containing an estimation formula for calculating the circuit scale of the LSIC, and an HDL file 203 containing HDL description data for the LSI. The MEM 28 is a memory for storing data necessary for decision processing, and comprises a description unit memory 204 for storing circuit description units identified from the HDL description data, and a connection information memory 205 for storing connection relationships of input and output signals between identified circuit description units.

Figure 3:
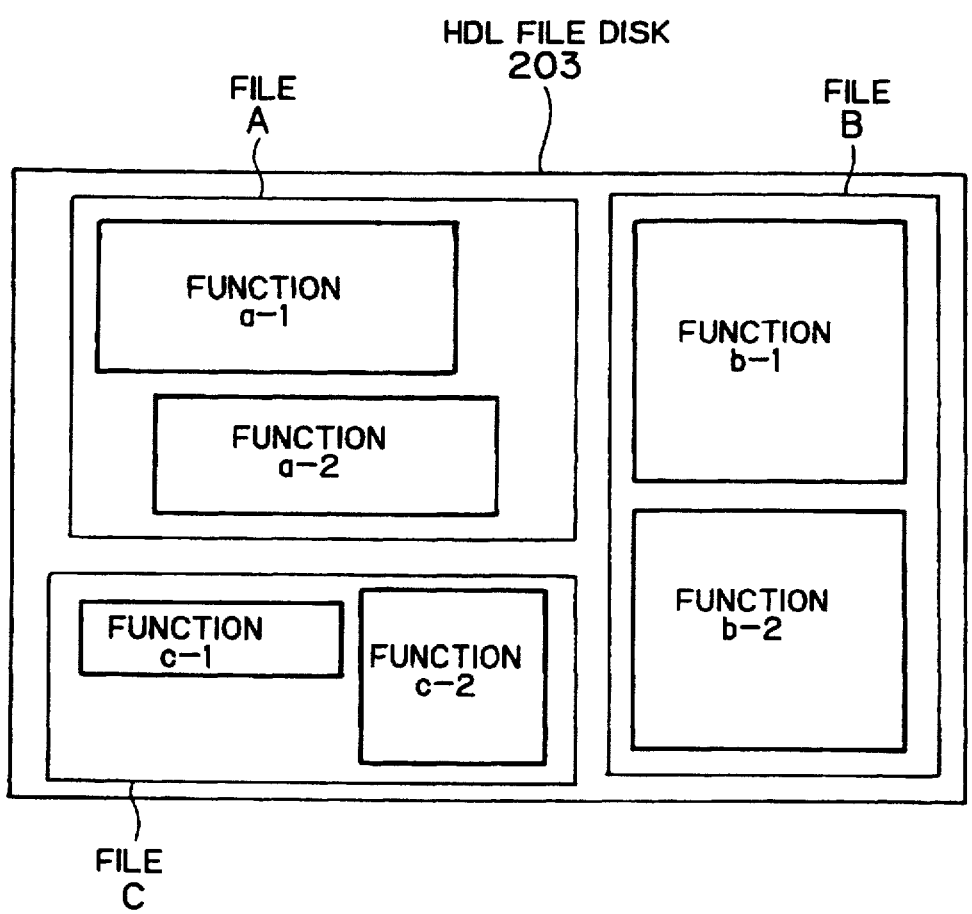
FIG. 3 is a schematic view showing an example of an HDL file for an LSI.

FIG. 3 is an example of a file configuration of HDL description data of the LSIC stored in the HDL file 203. HDL description data of the LSIC is comprised of three files, A–C, file A being divided into circuit functions a-1 and a-2, file B being divided into circuit functions b-1 and b-2, file C being divided into circuit functions c-1 and c-2, all of the files being stored on the DISK 203.

Figure 4:
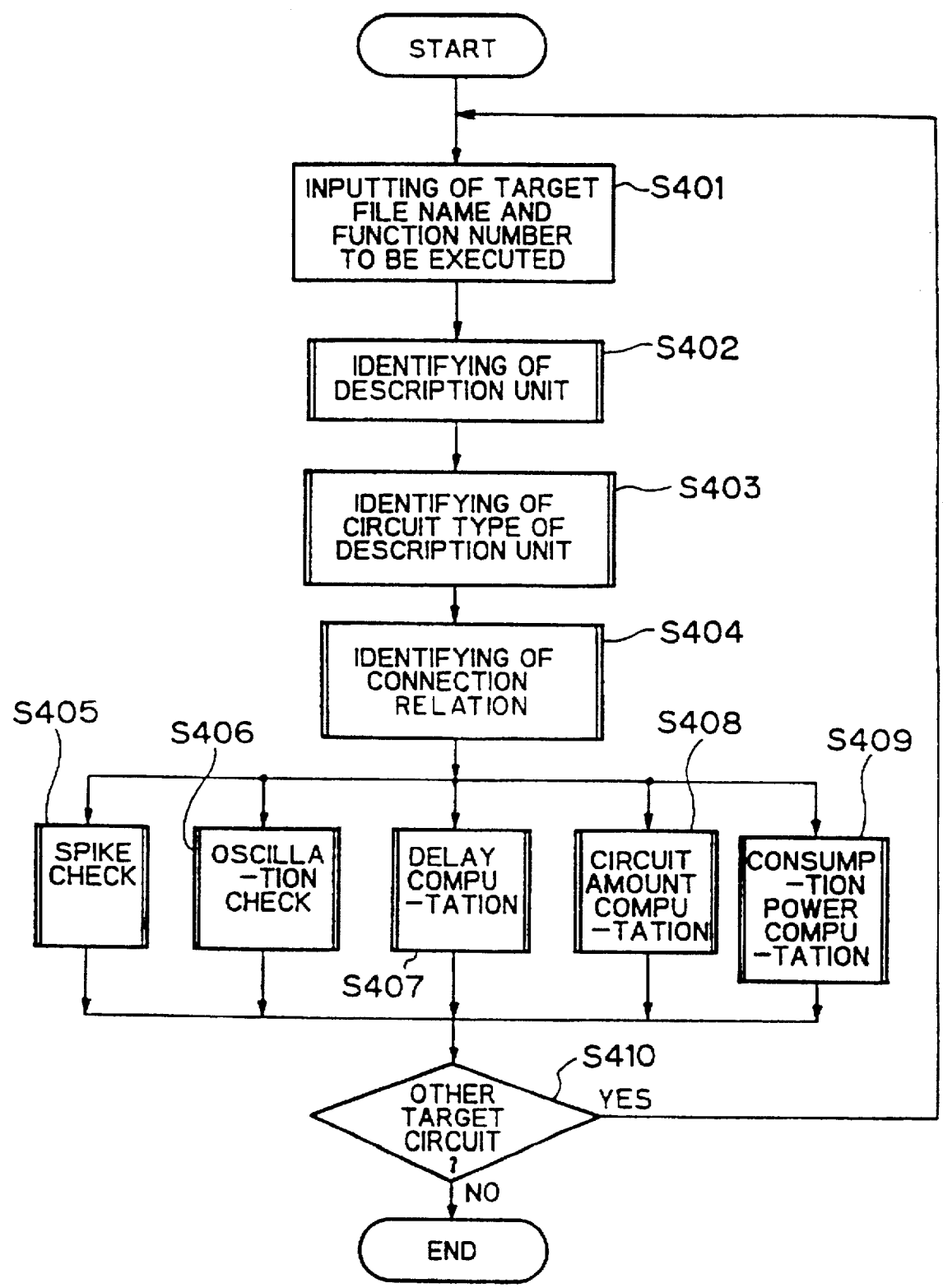
FIG. 4 is a flowchart showing an embodiment of the design system according to the present invention.

FIG. 4 is a flowchart showing the entire control flow of a hardware feasibility decision method according to the present invention. First, when a subject file name and a circuit function number are entered through the keyboard 21 (S401), the CPU 23 reads the specified circuit function of the subject file from the HDL file 203 of the DISK 27. Then, a description unit is identified from the read HDL description data of the specified circuit function (S402), the type of the identified description unit is determined which is a sequential circuit or a combinational circuit (S403), and connection relationships of output and input signals between the respective identified circuit description units (S404).

Referring to the resultant connection relationships within the subject circuit, the following processes are performed: a spike transfer check for sequential circuits (S405), an oscillation check (S406), calculation of delay time (S407), calculation of circuit scale (S408), and calculation of power consumption (S409). When such a hardware feasibility decision routine is completed, a check is made for whether there is any other subject circuit function (S410). If there is no subject circuit function, the control becomes a waiting state for keyboard input (S401), otherwise.. the processing terminates.

Figure 6:
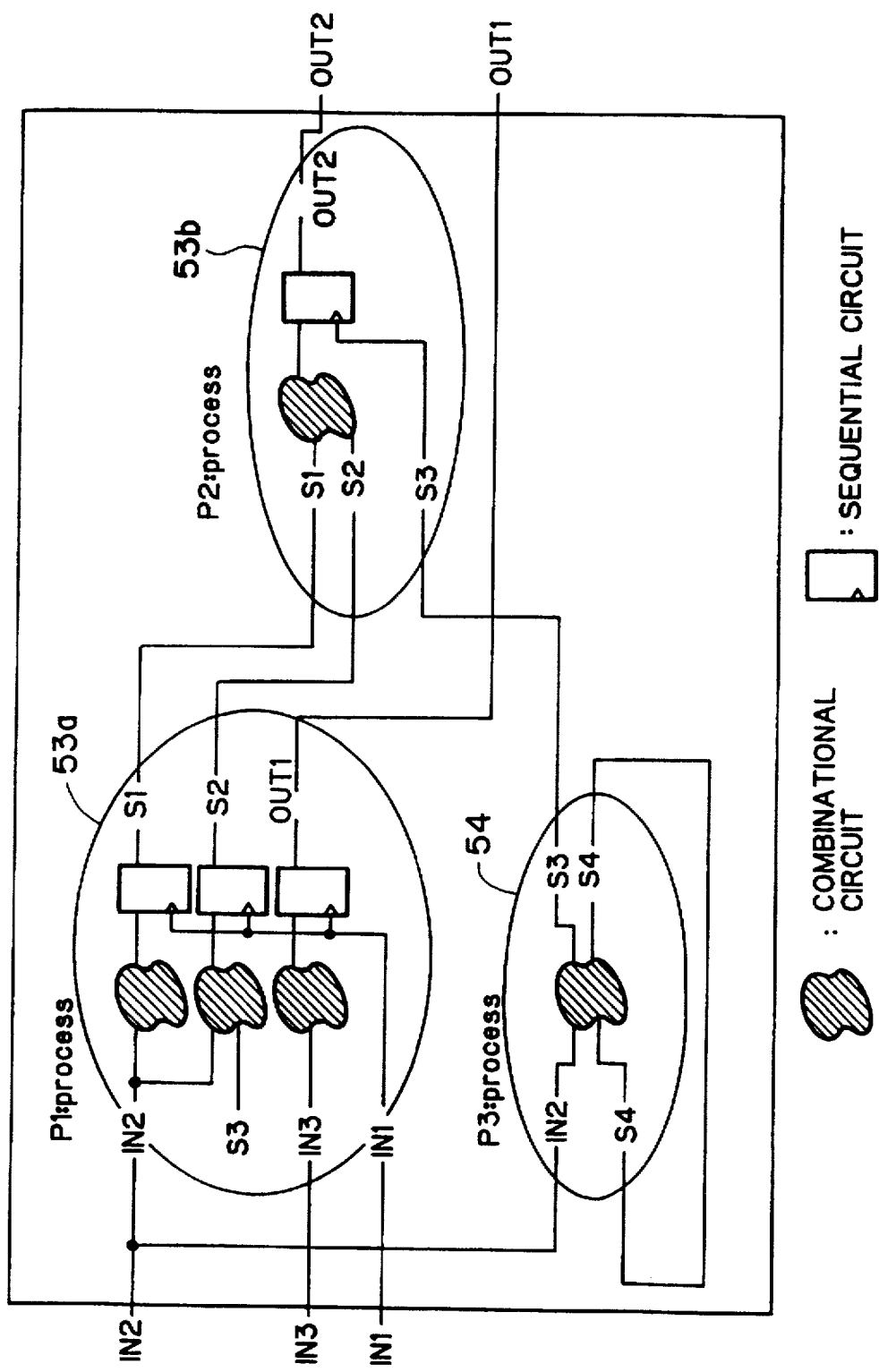
FIG. 6 is a block diagram showing a logic circuit configuration corresponding to the HDL description in FIG. 5.

An operation of the present embodiment will be explained in detail by referring to a sequential description using process statements as shown in FIG. 5. For reference, a block configuration of the logic circuit corresponding to the sequential description is shown in FIG. 6.

The description shown in FIG. 5 is comprised of an input and output declaration 51, a signal line declaration 52, a description unit of a sequential circuit 53a starting with a process statement P1, a description unit of a sequential circuit 53b starting with a process statement P2, and a description unit of a combinational circuit 54 starting with a process statement P3. The input and output declaration 51 declares signals IN1, IN2, and IN3 of input terminals of the logic circuit as well as output signals OUT1 and OUT2 of the output terminals. The signal line declaration 52 declares signals S1–S4 of signal lines in the logic circuit. Here, the input signal IN1 is a clock signal supplied from outside, while the signal S3 is a clock signal generated internally.

Each of the description units 53a, 53b, and 54 has a unit of description starting with a process statement and ending with an end process statement. A sensitivity list of the process statement P1 in the description unit of the sequential circuit 53a is as follows: (IN1, IN2, IN3, S3). The execution of the process statement P1 is started when at least one of the signal values in the sensitivity list changes. The same is true for process statements P2 and P3.

The description unit of the sequential circuit 53a goes from the process statement 501 to the end process statement 502, including a clock synchronization control statement 503 comprising a wait statement for synchronizing with the clock signal IN1, a decision statement starting with an if statement 504 and ending with an endif statement 505, and an assignment statement 506 indicated by an assignment operator "<=". The description unit of the sequential circuit 53b has a similar configuration, including a clock synchronization control statement for synchronization with the clock signal S3. However, the description unit of the combinational circuit 54 does not include a clock synchronization control statement.

The CPU 23 executes the decision routines S402–S409 shown in FIG. 4 by inputting sequential descriptions as described above from the HDL file.

Identification of Description Unit

First, description unit identification routine S402 identifies a series of statements from a process statement to an endprocess statement as a description unit of a circuit. Therefore, the routine S402 separates the respective description units 53a, 53b, and 54.

Identification of the Type of a Description Unit

Then, the description unit type identification routine S403 determines for each description unit whether it has a clock synchronization control statement comprising a wait statement containing a clock signal. A description unit containing a clock synchronization statement is determined to be of a sequential circuit (53a, 53b), and a description unit containing no clock synchronization statement is determined to be of a combinational circuit (54). The description units thus identified are stored in the description unit memory 204 in the MEM 28.

However, identification criteria are not limited to the presence or absence of a clock synchronization control statement as in this embodiment, but it may be the description sequence or position of a clock synchronization control statement, or any other suitable criteria.

Identification of Connection Relationships

Then, the connection relationship identification routine S404 identifies a connection relationship for each description unit by using the description units stored in the description unit memory 204 referring to the input and output declaration 51 and the signal line declaration 52. The identification of the connection relationship is performed by tracing back an assignment statement and an IF statement from which the output signal of a description unit is obtained until reaching an input signal of the input and output declaration 51. For example, since the output signal OUT2 of the sequential circuit description unit 53b is generated based on signals S1, S2, S3, and S4 as shown by the statements 507, the output signal OUT2 is connected to signals S1, S2, S3, and S4. Such a connection relationship is determined for each output signal of each description unit, and is stored in a format shown in FIG. 7 in the connection information memory 205 of the MEM 28.

By using the connection relationships identified for each output signal of each description unit, all connection paths from an output signal, OUT1 or OUT2, of the input and output declaration 51 to an input terminal signal, IN1 or IN2, are identified as shown in FIG. 8.

The connection path list as shown in FIG. 8 is generated in the following procedure: First, the CPU 23 looks for the output OUT1 from the connection relationships as shown in FIG. 7. Since the output OUT1 is connected to the input terminal signals IN1 and IN2, it identifies the first connection path 71 and the second connection path 72. Furthermore, since the signal S3 connected to the output OUT1 is of a signal line rather than an input terminal, the CPU 23 looks for the signal S3 from among all output signals. As shown in FIG. 7, since the output signal S3 is connected to the input terminal signal IN2, the third connection path 73 can be obtained. The connection path list for the connection paths 71–7B can be obtained, as shown in FIG. 8, by repeating the above routines.

Spike Check

Figure 9:
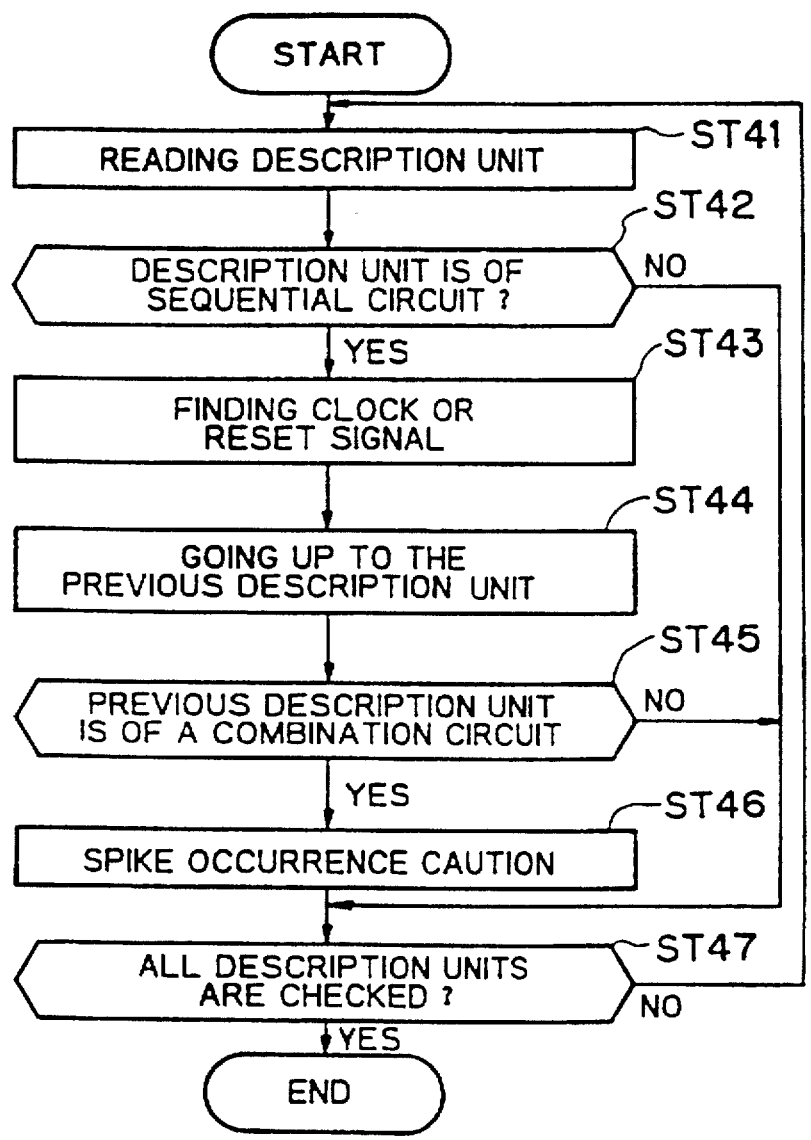
FIG. 9 is a flowchart showing a spike decision routine according to the present invention.

Generally, a spike is defined as a minute pulse appearing on a signal line of a logic circuit. Particularly, if a spike appears on a clock signal line or a reset signal line, it may cause malfunction of the flip-flop circuit leading to a timing problem. Whether or not a timing problem is caused by a spike is checked according to the following procedure:

FIG. 9 is a flowchart showing the spike check routine. First, it takes in data for each description unit from the HDL description data shown in FIG. 5 (ST41), and determines whether or not the description unit is of a sequential circuit (ST42). If so (Yes in ST42), the routine looks for a clock or reset signal in the description unit (ST43), going up to the previous description unit outputting the clock or reset signal (ST44), and determines whether or not the previous description unit is of a combinational circuit (ST45). If it is of a combinational circuit (Yes in ST45), the routine warns of a malfunction by a spike (ST46). If it is of a sequential circuit, not a combinational circuit (No in ST45), the routine determines whether or not all description units have been determined (ST47). If there remain any description units to be determined, the above decision is performed on the next description unit (ST41–ST46).

In summary, the above spike check routine determines the status to be "abnormal" if the routine reaches a combinational circuit when it traces back the clock or reset signal, and to be "normal" when all circuits are sequential. Since a combinational circuit is constituted of gate circuits such as AND or OR, there is a possibility of the occurrence of a spike by internal delay differences. On the other hand, since a sequential circuit is constituted of flip-flop circuits, there is no possibility of the occurrence of a spike. Therefore, in a case in which there is formed a circuit where a clock or reset signal of the LSIC is generated from a combinational circuit, the possibility of a spike appearing on a clock or reset signal becomes high, so that it is determined to be "abnormal."

In the example shown in FIGS. 5–8, since the clock signal S3 of the sequential circuit description unit 53b (process P2) is output from the combinational circuit description unit 54 (process P3) as shown by the connection path 79, the LSIC is determined to cause malfunction through a spike.

Oscillation Check

Oscillation is defined as a state where signals become unstable due to a loop formed between combinational circuits, and may cause a timing problem as with the spike. For example, as illustrated in FIG. 10, a simple logic circuit is assumed where the output of an AND gate 602 is input again therein through an inverter 603. The operation of the circuit becomes an oscillation state where signals of the AND gate 602 and the inverter 603 are unstable during an interval from the input of signal '1' from an input terminal 601 to the next input of signal '0'. This oscillation can be determined by the existence or absence of a loop between combinational circuits.

Figure 11:
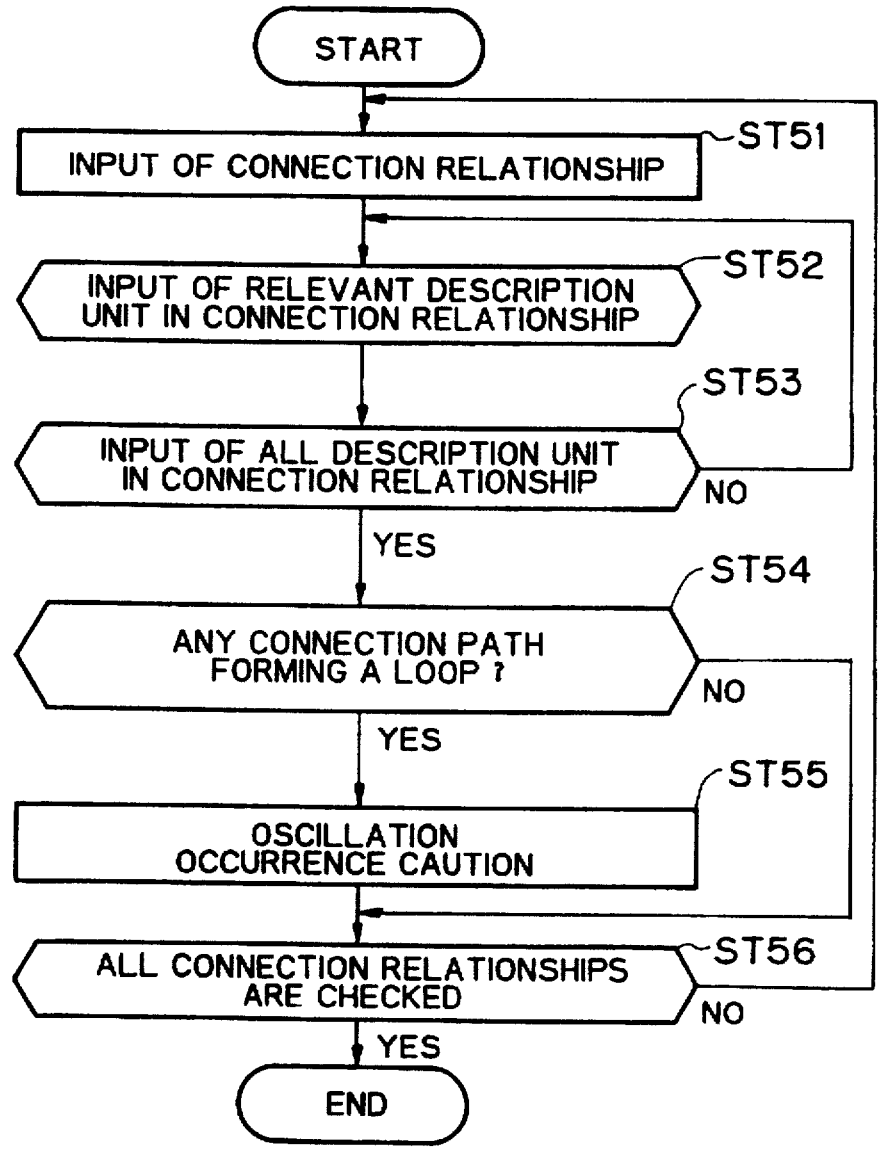
FIG. 11 is a flowchart showing an oscillation decision routine in the embodiment.

FIG. 11 shows an oscillation check routine. The routine inputs a connection relationship from the connection information memory 205 in the MEM 28 (ST51), and inputs a relevant description unit from the description unit memory 204 according to the connection relationship (ST52). Inputting relevant description units, the connection path list shown in FIG. 8 is produced. When all relevant description units are input (Yes in ST53), the routine determines whether or not there is any connection path constituting an oscillation loop by referring to the connection path list (ST54). That is, it is determined whether or not there is a connection path starting from a combinational circuit and returning to the original combinational circuit description unit without passing through a sequential circuit description unit. If such a connection path is found (Yes in ST54), the routine performs oscillation occurrence warning processing (ST55). If such a connection path is not found, it is determined whether or not all connection relationships are checked (ST56). If there remains any connection relationship (No in ST56), similar decision processing is performed on the next connection relationship (ST51–ST55).

In the example of FIGS. 5–8, the connection path 7B forms an oscillation loop. The output terminal OUT2 of the description unit 53b (process P2) is connected to the output signal S4 of the description unit 54 (process P3), and the signal S4 is an output signal of the description unit 54 (process P3) so that it is determined that there exists an oscillation loop.

Calculation of Delay Time

Generally, a long delay time lowers the maximum operation frequency of a logic circuit, and degrades the performance of the LSIC. Therefore, it is desirable to previously calculate the delay of the logic circuit, and to determine the feasibility of hardware. The calculation of the delay time requires that a delay time estimation formula be previously found.

Figure 12:
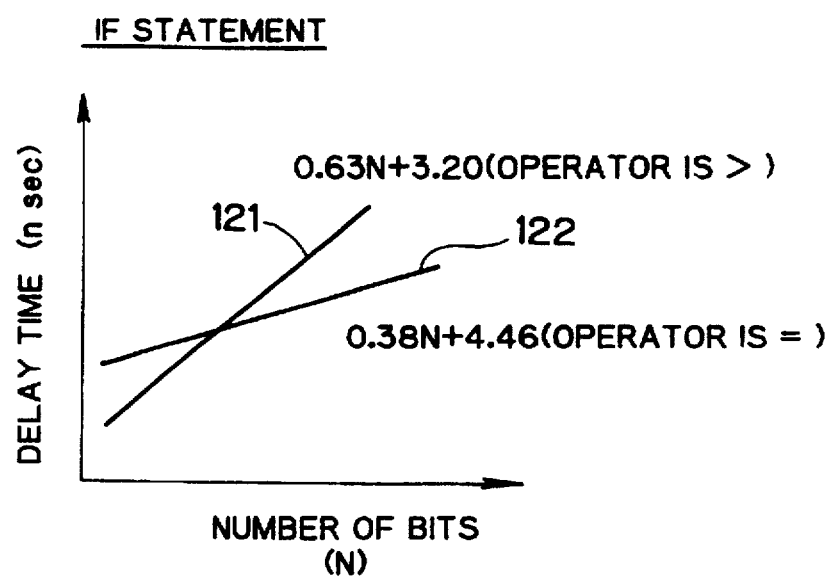
FIG. 12 is a graph showing a delay time estimation formula in an IF statement.

A delay time estimation formula for an IF statement can be found by independently varying the number of bits of variables, types of operators, and the number of nesting levels, and by calculating the respective delay times after developing them to a logic circuit. FIG. 12 is an example of a delay estimation formula, and shows a graph the delay time as a function of the number of bits using types of operators as parameters. The reference numeral 121 represents an estimation formula: 0.63N+3.20 when the operator is ">", while the reference numeral 122 represents an estimation formula: 0.38N+4.46 when the operator is "=". N is the number of bits of variables in the IF statement.

Figure 13:
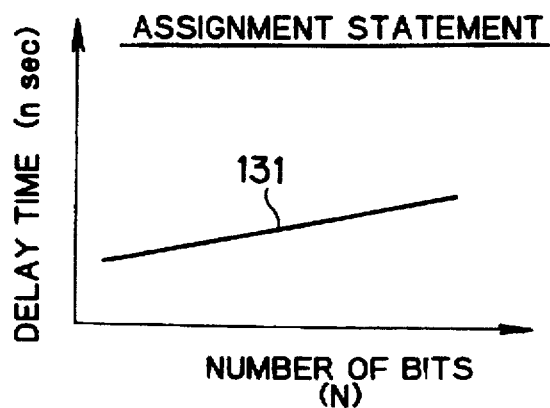
FIG. 13 is a graph showing a delay time estimation formula in an assignment statement.

A delay time estimation formula is determined for assignment statement by independently varying the number of bits of variables, the type of logic and arithmetic operator, and the number of operators, and by calculating respective delay times after developing them to a logic circuit. FIG. 13 is an example of an estimation formula, and shows a graph of the delay time as a function of the number of bits. The reference numeral 131 represents an estimation formula: 0.11N+0.2. N is the number of bits of variables in the assignment statement.

The estimation formulas for the IF and assignment statements thus found are stored in the delay calculation formula memory 201 of the DISK 27, and used for the calculation of the delay in this embodiment.

Figure 14:
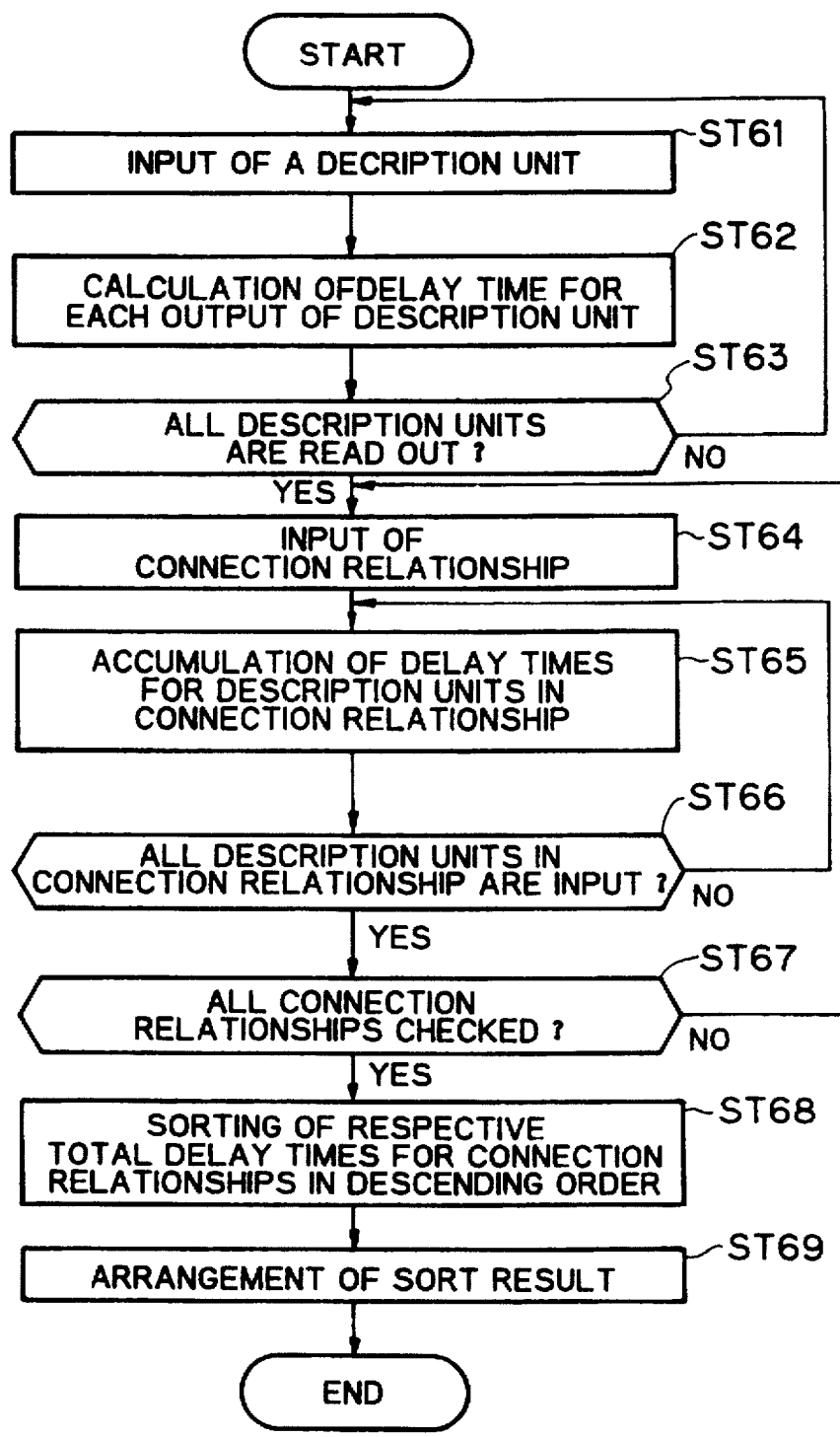
FIG. 14 is a flowchart showing a delay time calculation routine in the embodiment.

FIG. 14 shows a delay calculation routine of this embodiment. First, it reads a description unit from the description unit memory 204 in the MEM 28 (ST61), and calculates the delay time for each output of the description unit by using the estimation formula in the delay calculation formula memory 201 (ST62). The delay calculation for each output is performed for all of the description units (ST63).

Then, the routine reads one connection relationship from the connection information memory 205 in the MEM 28 (ST64), accumulates the delay times for all description units having the connection relationship, and finds the total delay time for the connection relationship (ST65, ST66). Then, it is determined whether or not all connection relationships are read (ST67). If there remain any connection relationships to be checked (No in ST67), the next connection relationship is read, and the total delay time is similarly found (ST65, ST66). Then, sorting is performed such that the respective total delay times for the connection relationships are sorted in a descending order (ST68), and arranges the data in the form of an easy-to-understand table form (ST69).

For example, in the case of the sequential circuit description unit 53a in FIG. 5, the delay time of the output signal S1 in the assignment statement 506 is the sum of the delay of the IF statement 504 and that of the assignment statement 506. Since the operator of the IF statement is "=", and the number of bits of variables is 1, the delay of the IF statement 504 is 0.38×1+4.46=4.84 (ns) by using the IF statement delay estimation formula 122 in FIG. 12. In addition, since the number of bits of variables is 8, the delay of the assignment statement 506 is 0.11×8+0.2=1.08 (ns) by using the estimation formula 131 in FIG. 13. Therefore, the delay time of the output signal S1 in the sequential circuit description unit 53a is 4.84+1.08=5.92 (ns).

After the delay time is thus calculated for each output of a description unit, the total delay time can be calculated for each connection path by using the connection path list in FIG. 8. For example, the delay time of the output terminal signal OUT2 is 5.92 (ns) of signal S1 for the connection path 74, and is the sum of the delay of signal S2 and that of signal S3 for the connection path 78.

Calculation of Circuit Scale

For the calculation of circuit scale, a circuit scale estimation formula is previously determined in a manner similar to that of the calculation of the delay and is stored in the circuit scale calculation formula memory 202. The circuit scale estimation formula is determined by varying the type of operators, the number of nesting levels, and the number of bits of variables which constitute an IF statement and an assignment statement, and by calculating the number of logic circuits and the number of gates. Therefore, it is possible to estimate the circuit scale from an arrangement of the IF or assignment statement.

Figure 15:
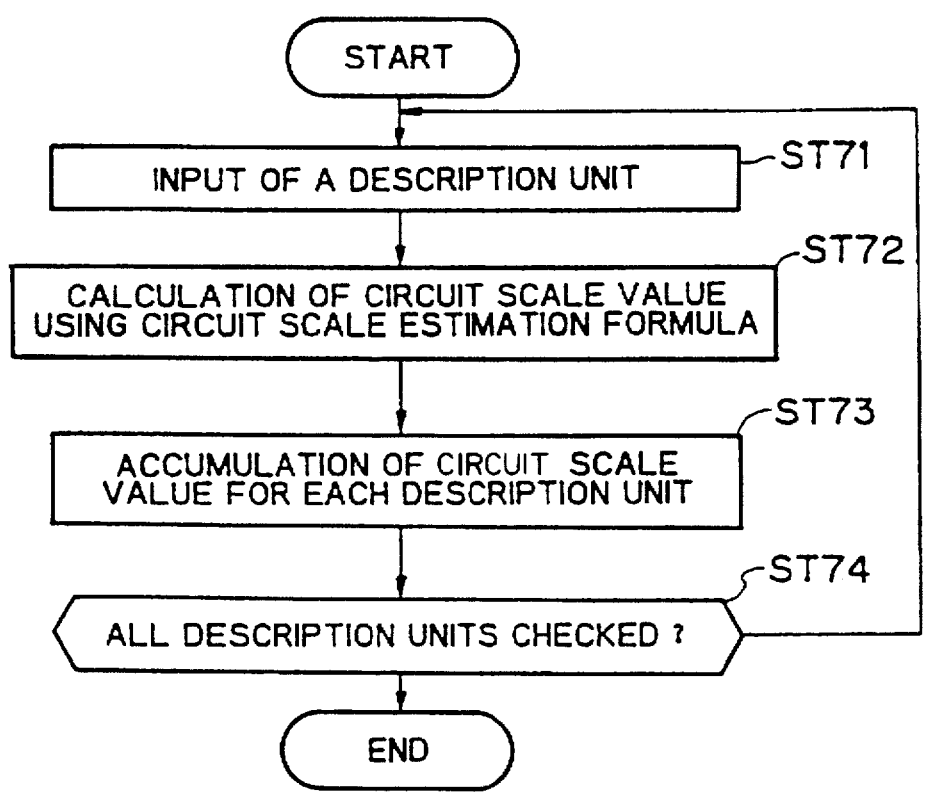
FIG. 15 is a flowchart showing a circuit scale calculation routine.

FIG. 15 shows a circuit scale calculation routine. First, it reads a description unit from the description unit memory 204 in the MEM 28 (ST 71), and calculates a circuit scale value (number of logic circuits) from the arrangement of the IF and assignment statements by using the estimation formula stored in the circuit scale calculation formula memory 202 (ST72). Then, it is possible to estimate the entire scale of the circuit by adding the circuit scale value for each description unit for all description units in the HDL description (ST73, ST74).

Calculation of Power Consumption

The power consumption of the LSIC can be generally calculated by using the following formula: (electrical energy per gate)×(number of gates)×(operating frequency). Therefore, in this embodiment, the power consumption is determined by multiplying the calculated circuit scale., the operating frequency, and the characterization factor (electric energy/gate) together.

Figure 16:
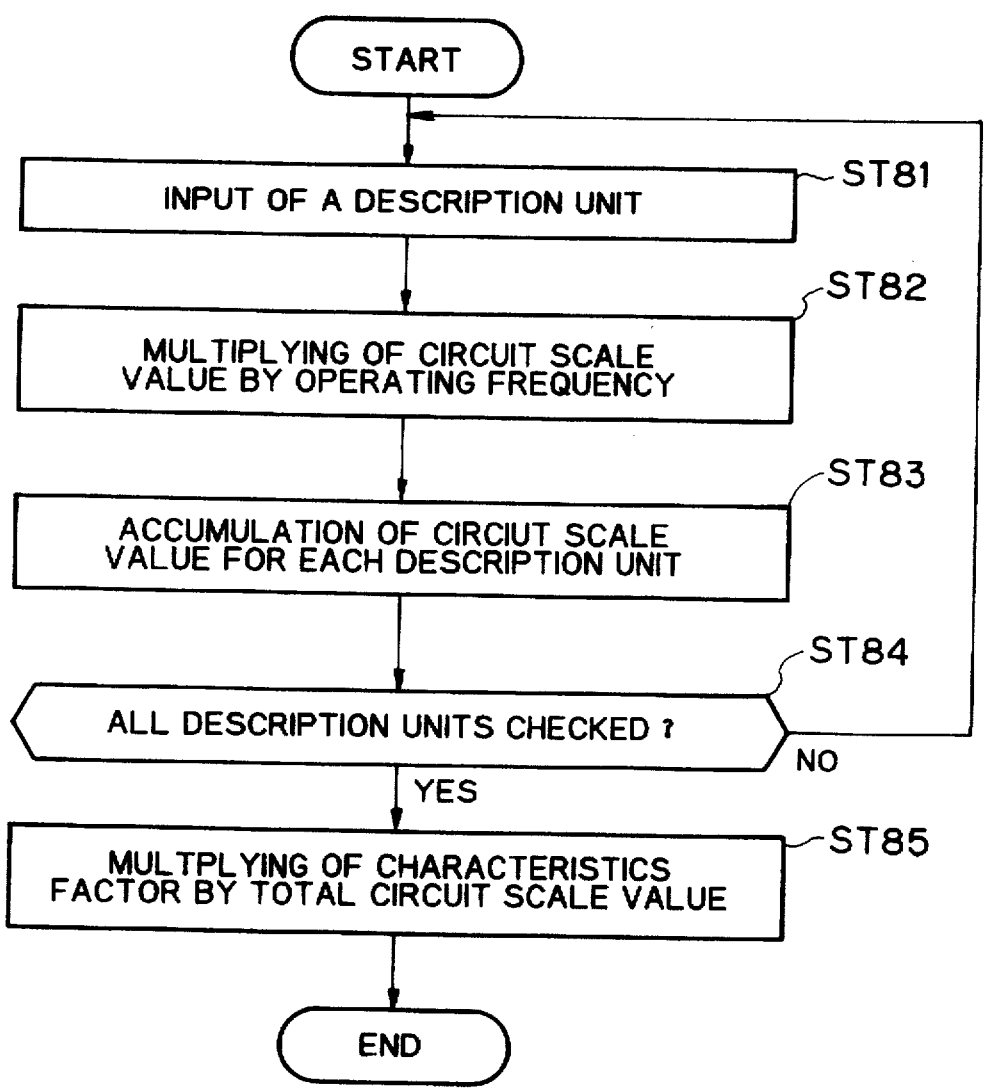
FIG. 16 is a flowchart showing a power consumption calculation routine.

FIG. 16 shows a power consumption calculation routine. It reads a description unit from the description unit memory 204 in MEM 28 (ST81), and multiplies the calculated circuit scale value for each description unit by the operating frequency (ST82). Then, the routine calculates the total accumulated value by adding the accumulated value of each description unit to all description units in the HDL description (ST83, ST84), and determines the total power consumption by multiplying the characterization factor (electric energy/gate) to the total accumulated value (ST85).

If the power consumption thus determined exceeds an originally planned power consumption limit, measures such as reselection of the LSIC and package or suppression of the circuit scale by reducing functions are taken.

As described, the design method according to the present invention determines, immediately after functional design using HDL, the feasibility of hardware by using the HDL description so that the feasibility can be determined in an early stage, and modification of the HDL description or redesign can be performed in a shorter period of time.

What is claimed is:

1. A method for designing a logic circuit by using hardware description language (HDL), said logic circuit comprising sequential circuits and combinational circuits, said method comprising steps of:

producing an HDL description of said logic circuit;

performing a feasibility decision by using said HDL description, said feasibility decision comprising:
a first decision for determining whether at least one of a clock signal and a reset signal of any of said sequential circuits is output from any of said combinational circuits; and
a second decision for determining whether an output signal of any of said combinational circuits is recursively input thereto without passing through one of said sequential circuits; and performing logic synthesis for said HDL description which passes said feasibility decision;

wherein said feasibility decision further comprises the steps of:
identifying description units in said HDL description, each of said description units comprising a startup condition description starting with changes of a variable representative of a signal and a procedure description comprising a condition decision statement and an assignment statement;
identifying each of said description units as one of a sequential circuit description unit and a combinational circuit description unit; and
identifying connection relationships of said description units based on input signals and output signals of said description units.

2. A method according to claim 1, wherein said first decision of said feasibility decision is performed by sequentially tracing back from a sequential circuit description unit to a description unit outputting at least one of said clock and reset signals referring to said connection relationships and determining whether said description unit outputting at least one of said clock and reset signals is of a combinational circuit each time tracing back.

3. A method according to claim 1, wherein said second decision of said feasibility decision is performed by determining whether there is a loop connection path in which an output signal of a combinational circuit is input to the same combinational circuit, and then by determining whether said loop connection path includes a sequential circuit description unit, referring to said connection relationships.

4. A method for designing a logic circuit by using hardware description language (HDL), said logic circuit comprising sequential circuits and combinational circuits, said method comprising steps of:

producing an HDL description of said logic circuit;

performing a feasibility decision by using said HDL description, said feasibility decision comprising:

a first decision for determining whether at least one of a clock signal and a reset signal of any of said sequential circuits is output from any of said combinational circuits; and a second decision for determining whether an output signal of any of said combinational circuits is recursively input thereto without passing through one of said sequential circuits; and performing logic synthesis for said HDL description which passes said feasibility decision;

wherein said feasibility decision further comprises the steps of:

calculating an output delay time of said logic circuit by using a predetermined delay estimation formula representing a relationship between a delay time of a statement including at least a variable and the number of bits of said at least a variable;

calculating a circuit scale of said logic circuit by using a predetermined circuit scale estimation formula representing a relationship between types of the statement and the number of logic gates; and calculating power consumption for said logic circuit based on said circuit scale.

5. A method according to claim 4, wherein said feasibility decision further comprises the steps of:

identifying description units in said HDL description, each of said description units comprising a startup condition description starting with changes of a variable representative of a signal and a procedure description comprising a condition decision statement and an assignment statement;

identifying each of said description units as one of a sequential circuit description unit and a combinational circuit description unit; and identifying connection relationships of said description units based on input signals and output signals of said description units.

6. A method according to claim 5, wherein said delay time calculation step in said feasibility decision comprises the steps of:

calculating a delay time of each output signal of each description unit of said HDL description by using said delay estimation formula; and calculating a total delay time for each connection relationship by adding delay times of description units having said each connection relationship.

7. A method for determining feasibility of a logic circuit by using hardware description language (HDL), said logic circuit comprising sequential circuits and combinational circuits, said method comprising the steps of:

a) producing an HDL description of said logic circuit;

b) performing a spike check and an oscillation check of the HDL description;

c) determining the feasibility of the logic circuit depending on whether the HDL description passes both the spike check and the oscillation check; and d) repeating the steps a) to c) by changing the HDL description until the HDL description passes both the spike check and the oscillation check;

wherein in the step b):

the spike check checks whether at least one of a clock signal and a reset signal of any of said sequential circuits is output from any of said combinational circuits; and the oscillation check checks whether an output signal of any of said combinational circuits is recursively input thereto without passing through one of said sequential circuits;

wherein the step b) further comprises the steps of:

identifying description units in said HDL description, each of said description units comprising a startup condition description starting with a change of a variable representative of a signal and a procedure description comprising a condition decision statement and an assignment statement;

identifying each of said description units as one of a sequential circuit description unit and a combinational circuit description unit; and identifying connection relationships of said description units based on input signals and output signals of said description units.

8. The method according to claim 7, wherein, in the step b), the spike check is performed by sequentially tracing back from a sequential circuit description unit to a description unit outputting at least one of said clock and reset signals referring to said connection relationships and determining whether said description unit outputting at least one of said clock and reset signals is of a combinational circuit sequentially tracing back.

9. The method according to claim 7, wherein, in the step b), the oscillation check is performed by determining whether there is a loop connection path in which an output signal of a combinational circuit is input to the same combinational circuit, and then by determining whether said loop connection path includes a sequential circuit description unit, referring to said connection relationships.

10. A method for determining feasibility of a logic circuit by using hardware description language (HDL), said logic circuit comprising sequential circuits and combinational circuits, said method comprising the steps of:

a) producing an HDL description of said logic circuit;

b) performing a spike check and an oscillation check of the HDL description;

c) determining the feasibility of the logic circuit depending on whether the HDL description passes both the spike check and the oscillation check; and d) repeating the steps a) to c) by changing the HDL description until the HDL description passes both the spike check and the oscillation check;

wherein said step c) further comprises the steps of:

calculating an output delay time of said logic circuit by using a predetermined delay estimation formula representing a relationship between a delay time of a statement including at least one variable and the number of bits of said at least one variable;

calculating a circuit scale of said logic circuit by using a predetermined circuit scale estimation formula representing a relationship between types of the statement and the number of logic gates; and calculating power consumption for said logic circuit based on said circuit scale.

11. The method according to claim 10, wherein said step c) further comprises the steps of:

identifying description units in said HDL description, each of said description units comprising a startup condition description starting with changes of a variable representative of a signal and a procedure description comprising a condition decision statement and an assignment statement;

identifying each of said description units as one of a sequential circuit description unit and a combinational circuit description unit; and identifying connection relationships of said description units based on input signals and output signals of said description units.

12. The method according to claim 11, wherein said step e) comprises the steps of:

calculating a delay time of each output signal of each description unit of said HDL description by using said delay estimation formula; and calculating a total delay time for each connection relationship by adding delay times of description units having said each connection relationship.

* * * * *